United States Patent
Li et al.

(10) Patent No.: US 12,101,953 B2
(45) Date of Patent: Sep. 24, 2024

(54) QUANTUM DOT LIGHT-EMITTING DIODE AND METHOD FOR FABRICATING THE SAME

(71) Applicant: TCL Technology Group Corporation, Huizhou (CN)

(72) Inventors: Ruifeng Li, Huizhou (CN); Lei Qian, Huizhou (CN); Weiran Cao, Huizhou (CN); Wenyong Liu, Huizhou (CN)

(73) Assignee: TCL Technology Group Corporation, Huizhou (CN)

( * ) Notice: Subject to any disclaimer, the term of this patent is extended or adjusted under 35 U.S.C. 154(b) by 483 days.

(21) Appl. No.: 17/419,669

(22) PCT Filed: Sep. 17, 2019

(86) PCT No.: PCT/CN2019/106143
§ 371 (c)(1),
(2) Date: Jun. 29, 2021

(87) PCT Pub. No.: WO2020/134208
PCT Pub. Date: Jul. 2, 2020

(65) Prior Publication Data
US 2022/0077417 A1    Mar. 10, 2022

(30) Foreign Application Priority Data
Dec. 29, 2018 (CN) .......................... 201811635038.0

(51) Int. Cl.
*H10K 50/17* (2023.01)
*H10K 50/115* (2023.01)
(Continued)

(52) U.S. Cl.
CPC .......... *H10K 50/171* (2023.02); *H10K 50/16* (2023.02); *H10K 71/00* (2023.02); *H10K 50/115* (2023.02);
(Continued)

(58) Field of Classification Search
None
See application file for complete search history.

(56) References Cited

U.S. PATENT DOCUMENTS 8,513,050 B1    8/2013    Bhattacharya et al.
10,270,039 B2 *   4/2019    Seo .................... H05B 33/20
(Continued)

FOREIGN PATENT DOCUMENTS

CN    105720206 A    6/2016
CN    105929635 A    9/2016
(Continued)

OTHER PUBLICATIONS

International Search Report for International Application No. PCT/CN2019/106143; Application Filing Date: Dec. 17, 2017; dated Dec. 19, 2019; with English Translation 6 pages.
(Continued)

*Primary Examiner* — Evren Seven
*Assistant Examiner* — Cole Leon Lindsey (57) ABSTRACT

The present application discloses a first aspect provides a quantum dot light-emitting diode, including: a cathode and an anode which are oppositely arranged; a quantum dot light-emitting layer arranged between the cathode and the anode; and a stacked layer arranged between the cathode and the quantum dot light-emitting layer. A stacked layer includes: a first metal oxide nanoparticle layer, and a mixed material layer arranged on a surface of the first metal oxide nanoparticle layer far away from the quantum dot light-emitting layer. The mixed material layer includes: first metal oxide nanoparticles, and a second metal oxide dispersed among gaps of the first metal oxide nanoparticles. First metal oxide nanoparticles in the first metal oxide nanoparticle layer serve as an electron transport material. A content of the second metal oxide in the mixed material layer
(Continued)

gradually increases in a direction from the quantum dot light-emitting layer to the cathode.

20 Claims, 3 Drawing Sheets

(51) Int. Cl.
  *H10K 50/16* (2023.01)
  *H10K 50/84* (2023.01)
  *H10K 71/00* (2023.01)
  *H10K 71/40* (2023.01)
  *H10K 102/00* (2023.01)

(52) U.S. Cl.
  CPC ............. *H10K 50/84* (2023.02); *H10K 71/40* (2023.02); *H10K 2102/00* (2023.02); *H10K 2102/3026* (2023.02); *H10K 2102/321* (2023.02); *H10K 2102/331* (2023.02); *H10K 2102/351* (2023.02)

(56) References Cited

U.S. PATENT DOCUMENTS

| | | | |
|---|---|---|---|
| 10,333,090 B2 * | 6/2019 | Zhou | ................... H10K 50/115 |
| 10,459,336 B2 | 10/2019 | Qi et al. | |
| 10,886,485 B2 | 1/2021 | Li | |
| 2019/0157566 A1 * | 5/2019 | Ryu | ..................... C07D 495/04 |
| 2019/0273214 A1 | 9/2019 | Li | |

FOREIGN PATENT DOCUMENTS

| | | |
|---|---|---|
| CN | 106252521 A | 12/2016 |
| CN | 107293647 A | 10/2017 |
| CN | 107492587 A | 12/2017 |
| CN | 108376745 A | 8/2018 |
| KR | 20130013810 A | 2/2013 |
| KR | 20160033520 A | 3/2016 |
| WO | 2009123763 A2 | 10/2009 |
| WO | 2014099080 A2 | 6/2014 |
| WO | 2017054887 A1 | 4/2017 |
| WO | 2020134208 A1 | 2/2020 |

OTHER PUBLICATIONS

Written Opinion for International Application No. PCT/CN2019/106143; Application Filing Date: Dec. 17, 2017; dated Dec. 19, 2019; 3 pages.

* cited by examiner

FIG. 4 providing an anode substrate, wherein an initial first metal oxide nanoparticle layer is arranged at a surface of the anode substrate, and first metal oxide nanoparticles in the initial first metal oxide nanoparticle layer serve as an electron transport material; —S01 vapor depositing an initial second metal layer onto the initial first metal oxide nanoparticle layer, and heating and annealing the anode substrate having the initial second metal layer vapor deposited thereon. —S02

FIG. 5 depositing an initial first metal oxide nanoparticle layer on the initial second metal layer, wherein first metal oxide nanoparticles in the initial first metal oxide nanoparticle layer serve as an electron transport material; and heating and annealing the cathode substrate having the initial first metal oxide nanoparticle layer deposited thereon. —E01 providing a cathode substrate, wherein the cathode substrate is provided with a cathode, and vapor depositing an initial second metal layer on a surface of the cathode substrate. —E02

FIG. 6

QUANTUM DOT LIGHT-EMITTING DIODE AND METHOD FOR FABRICATING THE SAME

CROSS-REFERENCE TO RELATED APPLICATIONS

This application is a 35 U.S.C. § 371 national stage application of PCT Application Ser. No. PCT/CN2019/106143, filed on Sep. 17, 2019, which claims priority to Chinese Patent Application No. 201811635038.0, filed on Dec. 29, 2018, the entire contents each of which are incorporated herein by reference in their entirety.

TECHNICAL FIELD

The present application relates to the field of display technology, and more particularly to a quantum dot light-emitting diode and a method for fabricating the same.

BACKGROUND

Light-emitting diode based on semiconductor quantum dots not only features high color purity, adjustable light-emitting wavelength, and high driving efficiency, but also is easy to prepare by solution method, which can reduce the production cost and process complexity of light-emitting diodes, thereby being an important developing technology for the future display industry. After nearly 25 years of development, the efficiency of quantum dots has increased from 0.01% to 20% above, and 27.6% (green) external quantum yields is obtained by the stacked layer and other structures. The device efficiency of the quantum dot light-emitting diode (QLED) is already quite close to that of the organic light emitting diode (OLED). However, although quantum dot devices have the above advantages, the working life of the current devices still does not fully meet the requirements of industrialization. At present, the device structure of QLED is similar to that of OLED. A sandwich structure similar to a pin junction is formed through a hole injection layer, a hole transport layer, a light-emitting layer, a first metal oxide nanoparticle layer, etc., which achieves the light-emitting effect by balancing the injection of electrons and holes.

However, the current quantum dot light-emitting diode and preparation method thereof still need to be developed.

Technical Problems

It is founded by inventors of the present application that the working life of the QLED device may be affected by the following three aspects. The first aspect is accumulation of charges at an unreasonable barrier interface, in particular, when the energy level structure of the device is unreasonable, holes and electrons will encounter the energy level barrier during injection process thereof, and thus tend to be accumulated at the barrier interface, and long-term charge accumulation will accelerate the degradation of the material. On the contrary, if the device has a reasonable working energy level structure, electrons and holes can be injected smoothly and reach the light-emitting area at the same time, thereby increasing the efficiency and extending the working life. The second aspect is the erosion of water vapor and oxygen. In particular, QLED devices are very sensitive to the water vapor and oxygen due to their materials. Therefore, it is necessary to isolate the water vapor and oxygen when fabricating and packaging the device. However, in a large-area packaging process, water and oxygen leakage easily occurs, which necessitates various measurements to protect the device. The third aspect is that relatively low current efficiency causes the device to work at a higher temperature for a long time. In particular, when the efficiency of the QLED device is low, it is necessary to increase the current density in order to achieve a certain brightness. However, when the device is operated for a long time under a larger current density, excessive heat is easily generated, which damages the organic materials in the device and reduces the working life.

It is an objective of embodiments of the present application to provide a quantum dot light-emitting diode and a method for fabricating the same, which aim at solving the problem of the short working life of the existing quantum dot light-emitting diode.

Technical Solutions

In order to solve the above-described technical problems, embodiments of the present application adopts the following technical solutions:

A first aspect provides a quantum dot light-emitting diode, which comprises: a cathode and an anode which are oppositely arranged; a quantum dot light-emitting layer arranged between the cathode and the anode; and a stacked layer arranged between the cathode and the quantum dot light-emitting layer. A stacked layer comprises: a first metal oxide nanoparticle layer, and a mixed material layer arranged on a surface of the first metal oxide nanoparticle layer far away from the quantum dot light-emitting layer. The mixed material layer comprises: first metal oxide nanoparticles, and a second metal oxide dispersed among gaps of the first metal oxide nanoparticles. First metal oxide nanoparticles in the first metal oxide nanoparticle layer serve as an electron transport material.

A content of the second metal oxide in the mixed material layer gradually increases in a direction from the quantum dot light-emitting layer to the cathode.

A second aspect provides a method for fabricating a quantum dot light-emitting diode. The method comprises the following steps:

providing an anode substrate, where an initial first metal oxide nanoparticle layer is arranged at a surface of the anode substrate, and first metal oxide nanoparticles in the initial first metal oxide nanoparticle layer serve as an electron transport material; and vapor depositing an initial second metal layer onto the initial first metal oxide nanoparticle layer, and heating and annealing the anode substrate having the initial second metal layer vapor deposited thereon.

A second aspect provides a method for fabricating a quantum dot light-emitting diode. The method comprises the following steps:

providing a cathode substrate, where the cathode substrate is provided with a cathode, and vapor depositing an initial second metal layer on a surface of the cathode substrate; and depositing an initial first metal oxide nanoparticle layer on the initial second metal layer, where first metal oxide nanoparticles in the initial first metal oxide nanoparticle layer serve as an electron transport material; and heating and annealing the cathode substrate having the initial first metal oxide nanoparticle layer deposited thereon.

Advantageous of the quantum dot light-emitting diode provided by the embodiments of the present application are as follows: the material degradation caused by charge accumulation at the interface is attenuated, thermal accumulation of the device is effectively reduced, and the working life of the device is significantly improved.

BRIEF DESCRIPTION OF THE DRAWINGS

For the purpose of describing the technical solutions in the embodiments of the present application more clearly, the accompanying drawings required for describing the embodiments or the prior techniques will be briefly introduced below. It is apparent that the accompanying drawings in the following description are merely some embodiments of the present application. Those skilled in the art may obtain other drawings according to the accompanying drawings without creative efforts.

DETAILED DESCRIPTION OF THE DRAWINGS

In order to make the objectives, technical solutions, and beneficial effects of the present application more clearer, the present application will be further described in detail below in accompany with the drawings and embodiments. It should be understood that the specific embodiments described herein are only used to explain the present application, and are not intended to limit the present application.

It should be understood that the terms "first" and "second" in embodiments of the present application are used for description purposes only, and cannot be understood as indicating or implying relative importance or implicitly indicating the number of indicated technical features. Thus, the features defined as "first" and "second" may explicitly or implicitly include one or more of such features. In the description of the present application, "multiple" means two or more than two, unless otherwise specifically defined.

Technical solutions of the present application will be described in details in conjunction with specific drawings and embodiments.

As shown in FIGS. 1-4, embodiments of the present application provide a quantum dot light-emitting diode, which comprises: a cathode and an anode which are oppositely arranged; a quantum dot light-emitting layer arranged between the cathode and the anode; and a stacked layer arranged between the cathode and the quantum dot light-emitting layer. A stacked layer comprises: a first metal oxide nanoparticle layer, and a mixed material layer arranged on a surface of the first metal oxide nanoparticle layer far away from the quantum dot light-emitting layer. The mixed material layer comprises: first metal oxide nanoparticles, and a second metal oxide dispersed among gaps of the first metal oxide nanoparticles. First metal oxide nanoparticles in the first metal oxide nanoparticle layer serve as an electron transport material.

A content of the second metal oxide in the mixed material layer gradually increases in a direction from the quantum dot light-emitting layer to the cathode.

In some embodiments, the quantum dot light-emitting diode of the above structure has significantly extended working life. The mixed material layer includes the first metal oxide nanoparticles for electron transportation as well as the second metal oxide, and the content of the second metal oxide presents a gradual change in its distribution in the mixed material layer (that is, the content of the second metal oxide in the mixed material layer gradually increases in the direction from the quantum dot light-emitting layer to the cathode), therefore, the obtained stacked layer has a decreased LUMO energy level, such that the injection barrier between the cathode and the first metal oxide nanoparticle layer is lowered, the material degradation caused by the electron accumulation at the barrier interface is attenuated, and the working life of the device is effectively improved.

In some embodiments, the second metal oxide is arranged between the first metal oxide nanoparticles and the cathode material, which is conducive to forming a more effectively Ohmic contact between the cathode and the stacked layer, particularly the first metal oxide nanoparticle layer, thereby lowering the starting voltage and the working voltage. In the meanwhile, the introduction of the second metal oxide may increase the oxygen vacancies and effectively improve the electron mobility. Therefore, in order to achieve the same brightness, the quantum dot light-emitting diode of the present application only requires much lower current to be driven thereby effectively reduces thermal accumulation of the device, and prolonging the working life of the device.

Figure 2:
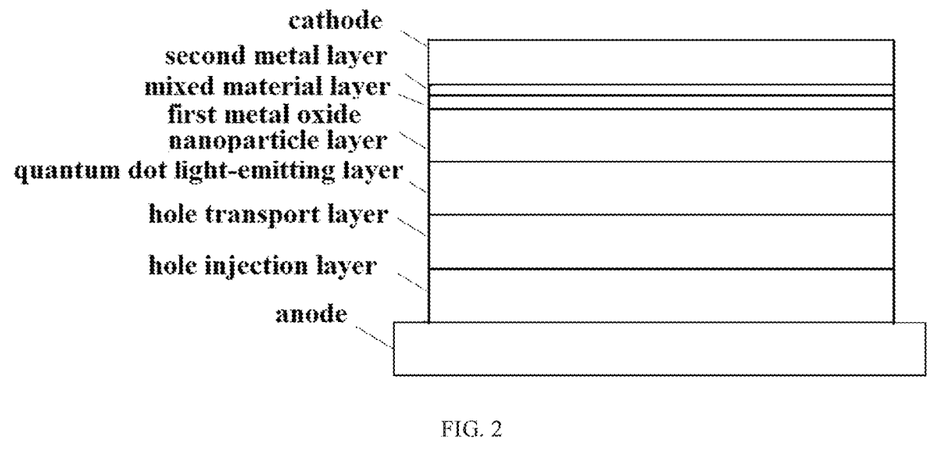
FIG. 2 is a schematic structure diagram of another quantum dot light-emitting diode of an upright structure provided by another embodiment of the present application.
Figure 3:
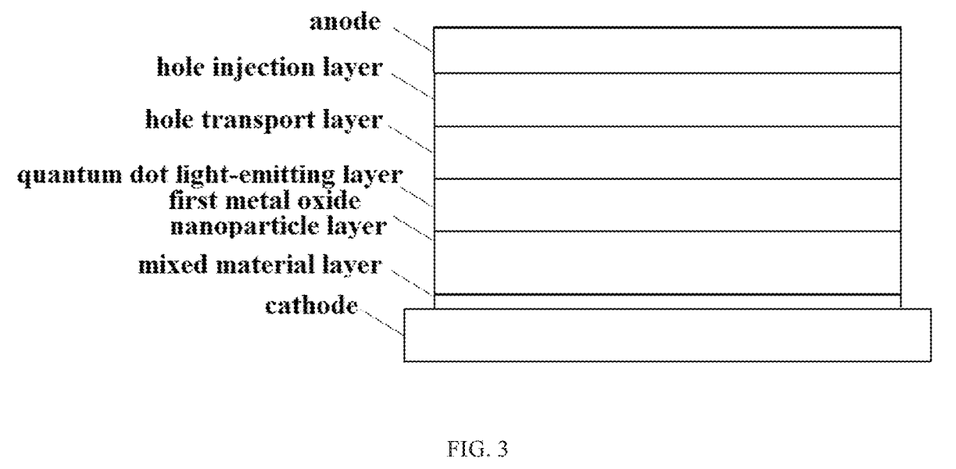
FIG. 3 is a schematic structure diagram of a quantum dot light-emitting diode of an inverted structure provided by another embodiment of the present application.
Figure 4:
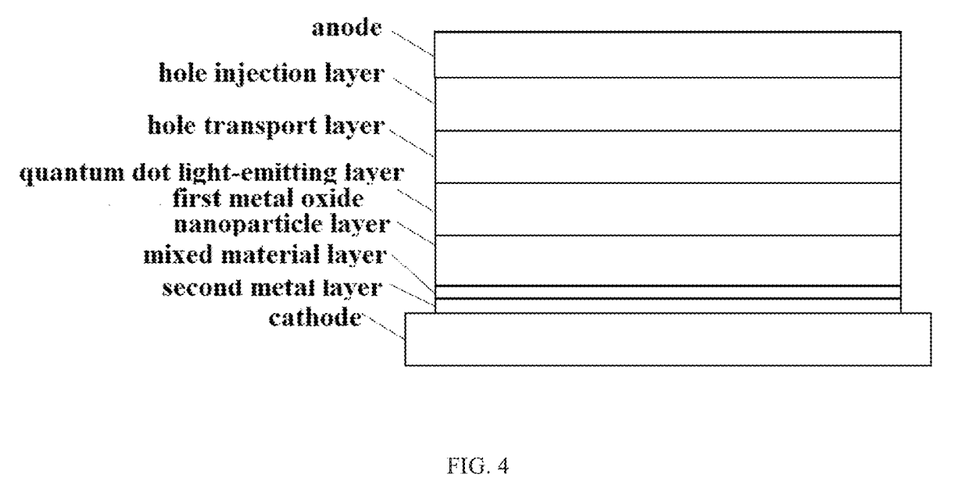
FIG. 4 is a schematic structure diagram of another quantum dot light-emitting diode of an inverted structure provided by another embodiment of the present application.

In some embodiments, according to the failure analysis of the quantum dot light-emitting diode, in the upright structure device, the top electrode (the cathode) tends to adsorb the water vapor and oxygen during the working process. When the water vapor and oxygen permeate, bubbles are easily formed between the top electrode and the first metal oxide nanoparticle layer, which will eventually cause the electrode to peel off. As shown in FIGS. 2 and 4, the stacked layer added with the second metal oxide is capable of effectively prevent the corrosion of the water vapor and the oxygen, which is conducive to improving the adhesion between the cathode and the stacked layer, improving the stability of the device, and extending the working life.

Figure 1:
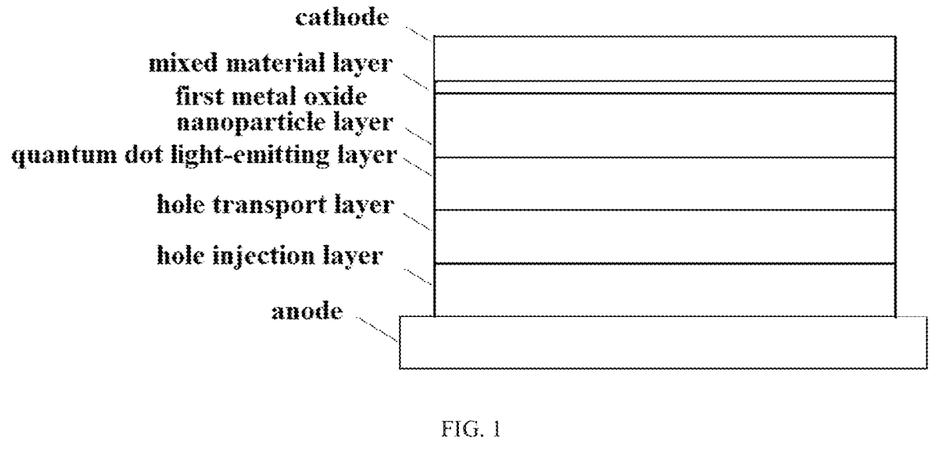
FIG. 1 is a schematic structure diagram of a quantum dot light-emitting diode of an upright structure of the present application.

The quantum dot light-emitting diode can adopts an upright structure and an inverted structure. As shown in FIGS. 1-2, the upright structure includes: an anode, a cathode, and a quantum dot light-emitting layer arranged between the anode and the cathode. The anode (bottom electrode) of the upright structure is arranged on the substrate. Hole function layers including a hole transport layer, a hole injection layer, and an electron blocking layer may also be arranged between the anode and the quantum dot light-emitting layer; and electron functional layers including the electron transport layer, an electron injection layer, and a hole blocking layer may also be arranged between the cathode (top electrode) and the quantum dot light-emitting layer. According to the different light emitting directions, the upright structure can be divided into a top-emitting upright structure (the substrate is arranged at the anode side) and a top-emitting upright structure (the substrate is arranged at the cathode side). As shown in FIGS. 1-2, the inverted structure includes: an anode, a cathode, and a quantum dot light-emitting layer arranged between the anode and the cathode. The cathode (bottom electrode) of the inverted structure is arranged on the substrate. Hole function layers including a hole transport layer, a hole injection layer, and an electron blocking layer may also be arranged between the anode (top electrode) and the quantum dot light-emitting layer; and electron functional layers including the electron transport layer, an electron injection layer, and a hole blocking layer may also be arranged between the cathode and the quantum dot light-emitting layer. According to the different light emitting directions, the inverted structure can be divided into a top-emitting inverted structure (the substrate is arranged at the cathode side) and a top-emitting inverted structure (the substrate is arranged at the anode side).

The cathode or anode material includes, but is not limited to, one or more of metal materials, carbon materials, and metal oxides. The metal material includes, but is not limited to, one or more of Al, Ag, Cu, Mo, Au, Ba, Ca, and Mg. The carbon material includes, but is not limited to, one or more of graphite, carbon nanotubes, graphene, and carbon fibers. The metal oxide may be doped or undoped metal oxide, including, but not limited to, one or more of ITO, FTO, ATO, AZO, GZO, IZO, MZO, AMO, and may also include a composite electrode formed by sandwiching metals between the doped or undoped metal oxide. In some particular embodiments, the composite electrode includes one or more of AZO/Ag/AZO, AZO/Al/AZO, ITO/Ag/ITO, ITO/Al/ITO, ZnO/Ag/ZnO, ZnO/Al/ZnO, $TiO_2$/Ag/$TiO_2$, $TiO_2$/Al/$TiO_2$, ZnS/Ag/ZnS, ZnS/Al/ZnS, $TiO_2$/Ag/$TiO_2$, and $TiO_2$/Al/$TiO_2$. In case that the top-emitting device is adopted, the top electrode is a transparent electrode, and in some embodiments, the top electrode adopts the above metal or metal composite electrode, and the thickness of the metal part should not exceed 20 nm, so as to ensure that the top electrode has a visible light transmittance of no less than 90%. In case that the bottom-emitting device is adopted, the bottom electrode is a transparent electrode, and in some embodiments, the bottom electrode adopts the above metal or metal composite electrode, and the thickness of the metal part should not exceed 20 nm, so as to ensure that the bottom electrode has a visible light transmittance of no less than 90%.

In some embodiments of the present application, the quantum dot light-emitting layer is arranged between the cathode and the anode. In some embodiments of the present application, the quantum dot light-emitting layer is made of a material being a direct band gap compound semiconductor having light-emitting capability, which includes but is not limited to one or more of II-VI compounds, III-V compounds, II-V compounds, III-VI compounds, IV-VI compounds, I-III-VI compounds, II-IV-VI compounds, and IV simple substances.

In some embodiments, the semiconductor materials used in the quantum dot light-emitting layer include a nanocrystalline of II-VI semiconductors or a II-VI core-shell structured nano-crystalline. In particular, the nano-crystalline of II-VI semiconductors includes, but are not limited to, CdS, CdSe, CdTe, ZnS, ZnSe, ZnTe, HgS, HgSe, HgTe, PbS, PbSe, PbTe, and other binary, ternary, and quaternary II-VI compounds.

In some embodiments, the semiconductor materials used in the quantum dot light-emitting layer include a nanocrystalline of III-V semiconductors or a III-V core-shell structured nano-crystalline. In particular, the nano-crystalline of III-V semiconductors includes, but are not limited to, GaP, GaAs, InP, InAs, and other binary, ternary, and quaternary III-V compounds.

In some embodiments, the semiconductor materials configured for the quantum dot light-emitting layer are not limited to II-V compounds, III-VI compounds, IV-VI compounds, I-III-VI compounds, II-IV-VI compounds, and IV elements.

In some embodiments, the material for the quantum dot light-emitting layer may be at least one of a doped or undoped inorganic perovskite semiconductor and an organic-inorganic hybrid perovskite semiconductor. Specifically, in some embodiments, the inorganic perovskite semiconductor has a structural formula of $AMX_3$, where A is $Cs^+$ ion, M is a divalent metal cation, including but not limited to $Pb^{2+}$, $Sn^{2+}$, $Cu^{2+}$, $Ni^{2+}$, $Cd^{2+}$, $Cr^{2+}$, $Mn^{2+}$, $Co^{2+}$, $Fe^{2+}$, $Ge^{2+}$, $Yb^{2+}$, $Eu^{2+}$, and X is halogen anion, including but not limited to $Cl^-$, $Br^-$, $I^-$.

In some embodiments, the organic-inorganic hybrid perovskite semiconductor has a structural formula of $BMX_3$, where B is an organic amine cation, including but not limited to $CH_3(CH_2)_{n-2}NH_3^+$ (n≥2) or $NH_3(CH_2)_nNH_3^{2+}$ (n≥2). When n=2, the inorganic metal halide octahedrons $MX_6^{4-}$ are connected in a manner of co-apex, the metal cation M is located in the body center of each halogen octahedron, and the organic amine cations B are filled in the gap between the octahedrons, forming an infinitely extending three-dimensional structure. When n>2, the inorganic metal halide octahedrons $MX_6^{4-}$ connected in the manner of co-apex extend in a two-dimensional direction to form a layered structure, and an organic amine cationic bilayer (protonated monoamine) or organic amine cation monolayer (protonated diamine) is intercalated in the layered structure, the organic layer and the inorganic layer overlap to form a stable two-dimensional layered structure; M is a divalent metal cation, including but not limited to $Pb^{2+}$, $Sn^{2+}$, $Cu^{2+}$, $Ni^{2+}$, $Cd^{2+}$, $Cr^{2+}$, $Mn^{2+}$, $Co^{2+}$, $Fe^{2+}$, $Ge^{2+}$, $Yb^{2+}$, $Eu^{2+}$; X is a halogen anion, including but not limited to $Cl^-$, $Br^-$, and $I^-$.

In some embodiments, the stacked layer is arranged between the cathode and the quantum dot light-emitting layer. Specifically, stacked layer comprises: a first metal oxide nanoparticle layer, and a mixed material layer arranged on a surface of the first metal oxide nanoparticle layer far away from the quantum dot light-emitting layer. The mixed material layer comprises: first metal oxide nanoparticles, and a second metal oxide dispersed among gaps of the first metal oxide nanoparticles. First metal oxide nanoparticles in the first metal oxide nanoparticle layer serve as an electron transport material. A content of the second metal oxide in the mixed material layer gradually increases in a direction from the quantum dot light-emitting layer to the cathode.

In some embodiments, the mixed material layer does not contain a second metal.

In some specific embodiments, the mixed material layer is composed of the first metal oxide nanoparticles and the second metal oxide.

In some embodiments, the second metal oxide is one or more selected from the group consisting of an oxide of aluminum, an oxide of magnesium, an oxide of titanium, an oxide of copper, an oxide of calcium, and an oxide of indium.

In some embodiments, the mixed material layer further comprises a second metal dispersed among the gaps of the first metal oxide nanoparticles.

In some embodiments, the second metal is one or more selected from the group consisting of aluminum, magnesium, titanium, copper, calcium, and indium. The second metal of said species have high activity and is capable of reacting with hydroxyl groups on surfaces of the first metal oxide nanoparticles to form metal oxides.

In some specific embodiments, the mixed material layer further comprises a second metal dispersed among the gaps of the first metal oxide nanoparticles. In the direction from the quantum dot light-emitting layer to the cathode, the content of the second metal oxide gradually increases, and a content of the second metal gradually increases.

In some specific embodiments, the mixed material layer is composed of: the first metal oxide nanoparticles, and the second metal oxide and the second metal that are dispersed among the gaps of the first metal oxide nanoparticles.

In some embodiments, the quantum dot light-emitting diode further comprises a second metal layer bound to a surface of the stacked layer facing the cathode. In some specific embodiments, second metal in the second layer is one or more selected from the group consisting of aluminum, magnesium, titanium, copper, calcium, and indium. By adding the second metal layer, the adhesion between the second metal layer and the cathode layer is improved, whereby forming the Ohmic contact. However, if this second metal layer has a thickness of >10 nm, the light transmission performance will be affected. When the device is in an upright top-emitting or inverted bottom-emitting structure, light cannot be effectively emitted. In some embodiments, the second metal layer has a thickness of between 0 and 5 nm; and the thickness of the second metal layer is not 0.

In some embodiments, the first metal oxide nanoparticles in the first metal oxide nanoparticle layer serve as the electron transport material; and the first metal oxide nanoparticles are one or more selected from the group consisting of $ZnO$, $TiO_2$, $SnO_2$, $Ta_2O_3$, $ZrO_2$, $NiO$, $TiLiO$, $ZnAlO$, $ZnMgO$, $ZnSnO$, $ZnLiO$, and $InSnO$.

In some embodiments, the quantum dot light-emitting layer, the stacked layer, and the cathode are stacked together. The quantum dot light-emitting diode of the above structure has significantly extended working life. The mixed material layer includes the first metal oxide nanoparticles for electron transportation as well as the second metal oxide, and the content of the second metal oxide presents a gradual change in its distribution in the mixed material layer (that is, the content of the second metal oxide in the mixed material layer gradually increases in the direction from the quantum dot light-emitting layer to the cathode), therefore, the obtained stacked layer has a decreased LUMO energy level, such that the injection barrier between the cathode and the first metal oxide nanoparticle layer is lowered, the material degradation caused by the electron accumulation at the barrier interface is attenuated, and the working life of the device is effectively improved.

In addition, the second metal oxide is arranged between the first metal oxide nanoparticles and the cathode material, which is conducive to forming a more effectively Ohmic contact between the cathode and the stacked layer, particularly the first metal oxide nanoparticle layer, thereby lowering the starting voltage and the working voltage. In the meanwhile, the introduction of the second metal oxide may increase the oxygen vacancies and effectively improve the electron mobility. Therefore, in order to achieve the same brightness, the quantum dot light-emitting diode of the present application only requires much lower current to be driven thereby effectively reduces thermal accumulation of the device, and prolonging the working life of the device. Moreover, according to the failure analysis of the quantum dot light-emitting diode, in the upright structure device, the top electrode (the cathode) tends to adsorb the water vapor and oxygen during the working process. When the water vapor and oxygen permeate, bubbles are easily formed between the top electrode and the first metal oxide nanoparticle layer, which will eventually cause the electrode to peel off. In the present application, the stacked layer added with the second metal oxide is capable of effectively prevent the corrosion of the water vapor and the oxygen, which is conducive to improving the adhesion between the cathode and the stacked layer, improving the stability of the device, and extending the working life. By adding the second metal layer, the adhesion between the second metal layer and the cathode layer is improved, whereby forming the Ohmic contact.

In some embodiments, the hole injection layer is made of a material including, but not limited to, one or more selected from the group consisting of PEDOT: PSS, CuPc, F4-TCNQ, HATCN, transition metal oxides, and transition metal chalcogenides. The transition metal oxides include, but are not limited to, one or more of $NiO_x$, $MoO_x$, $WO_x$, $CrO_x$, and $CuO$. The transition metal chalcogenides include, but are not limited to, one or more of $MoS_x$, $MoSe_x$, $WS_x$, $WSe_x$, and $CuS$.

In some embodiments, the hole transport layer includes, but are not limited to, at least one selected from the group consisting of poly(9,9-dioctylfluorene-co-N-(4-butylphenyl)diphenylamine), polyvinylcarbazole, poly[N,N'-bis(4-butylphenyl)-N,N'-bis(phenyl)-benzidine], poly(9,9-dioctylfluorene-co-bis-N,N-phenyl-1,4-phenylenediamine), 4,4',4"-tris(carbazol-9-yl)-triphenylamine, 4,4'-bis(9-carbazolyl)-1,1'-biphenyl, N,N'-bis-(3-methylphenyl)-N,N'-Bis-phenyl-(1,1'-biphenyl)-4,4'-diamine, N,N'-Bis(1-naphthalenyl)-N,N'-bisphenyl-(1,1'-biphenyl)-4,4'-diamine, graphene, and C60.

In some embodiments, the hole transport layer is selected from inorganic materials having hole transport capabilities, including but not limited to at least one of NiO, MoO, WO, CrO, CuO, MoS, MoSe, WS, WSe, and CuS.

Figure 5:
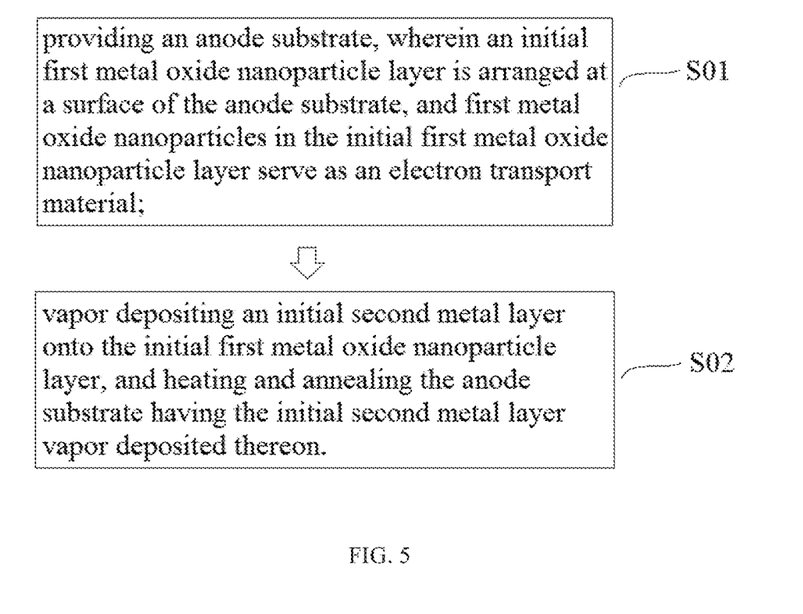
FIG. 5 is a flow chart of a method for fabricating a quantum dot light-emitting diode provided by another embodiment of the present application.

As shown in FIG. 5, some embodiments of the present application provides a method for fabricating a quantum dot light-emitting diode, comprising the following steps:

S01: providing an anode substrate, where an initial first metal oxide nanoparticle layer is arranged at a surface of the anode substrate, and first metal oxide nanoparticles in the initial first metal oxide nanoparticle layer serve as an electron transport material; and S02: vapor depositing an initial second metal layer onto the initial first metal oxide nanoparticle layer, and heating and annealing the anode substrate having the initial second metal layer vapor deposited thereon.

In some embodiments of the present application, the anode substrate may include: a substrate, an anode stacked on a surface of the substrate, and a quantum dot light-emitting layer stacked on a surface of the anode. In other embodiments of the present application, the anode substrate may include: a substrate, an anode stacked on a surface of the substrate, a hole injection layer stacked on a surface of the anode, and a quantum dot light-emitting layer stacked on a surface of the hole injection layer. In still other embodiments of this application, the anode substrate may include: a substrate, an anode stacked on a surface of the substrate, a hole transport layer stacked on a surface of the anode, and a quantum dot light-emitting layer stacked on a surface of the hole transport layer. In still other embodiments of this application, the anode substrate may include: a substrate, an anode stacked on a surface of the substrate, a hole injection layer stacked on a surface of the anode, a hole transport layer stacked on a surface of the hole injection layer, and a quantum dot light-emitting layer stacked on a surface of the hole transport layer. In some embodiments of the present application, the anode substrate may include: a substrate, an anode stacked on a surface of the substrate, a hole injection layer stacked on a surface of the anode, and a hole transport layer stacked on a surface of the hole injection layer, an electron blocking layer stacked on a surface of the hole transport layer, and a quantum dot light-emitting layer stacked on a surface of the electron blocking layer. In some embodiments of this application, the anode substrate may include: a substrate, an anode stacked on a surface of the substrate, a hole injection layer stacked on a surface of the anode, a hole transport layer stacked on a surface of the hole injection layer, an electron blocking layer stacked on a surface of the hole transport layer, a quantum dot light-emitting layer stacked on a surface of the electron blocking layer, and a hole blocking layer is stacked on a surface of the quantum dot light-emitting layer. A surface of the anode substrate is provided with a layer of the initial first metal oxide nanoparticle layer.

Figure 6:
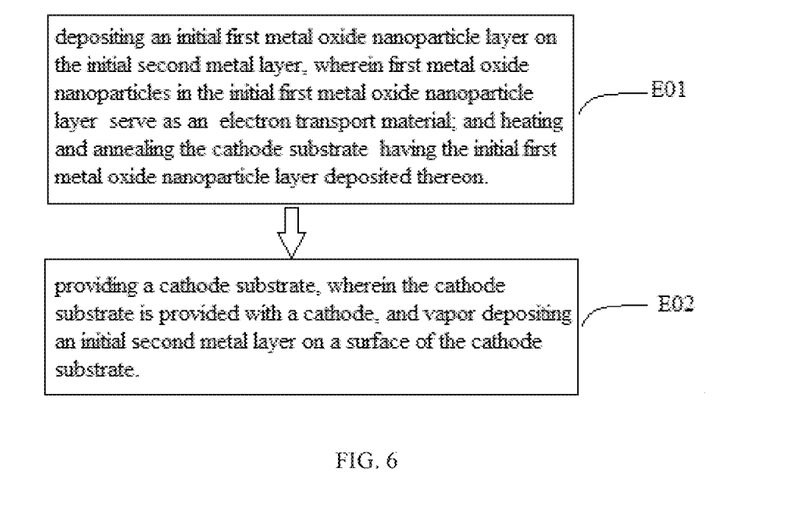
FIG. 6 is a flow chart of another method for fabricating a quantum dot light-emitting diode provided by another embodiment of the present application.

As shown in FIG. 6, some embodiments of the present application provides a method for fabricating a quantum dot light-emitting diode, comprising the following steps:

E01, providing a cathode substrate, where the cathode substrate is provided with a cathode, and vapor depositing an initial second metal layer on a surface of the cathode substrate; and E02, depositing an initial first metal oxide nanoparticle layer on the initial second metal layer, where first metal oxide nanoparticles in the initial first metal oxide nanoparticle layer serve as an electron transport material; and heating and annealing the cathode substrate having the initial first metal oxide nanoparticle layer deposited thereon.

In some embodiments of the present application, the cathode substrate includes: a substrate, and a cathode stacked on the surface of the substrate. In some embodiments of the present application, the second substrate includes: a substrate, a cathode stacked on a surface of the substrate, and an electron injection layer stacked on a surface of the cathode.

In some embodiments, during the heating and annealing process, the second metal atoms in the initial second metal layer gradually penetrate into the initial first metal oxide nanoparticle layer under the action of heat, because the first metal oxide nanoparticles have a higher surface activity, the second metal atoms react with the oxygen atoms in the first metal oxide nanoparticles or the hydroxyl ligands at the surfaces of the first metal oxide nanoparticles, thereby being oxidized to form the second metal oxide. The amount of the second metal atoms penetrating into the initial metal oxide nanoparticle layer gradually decreases when going deeper into the initial metal oxide nanoparticle layer and gradually increases when approaching a surface layer of the initial metal oxide nanoparticle layer. The total amount of the second metal atoms penetrating into the initial first metal oxide nanoparticle layer is very small, and in the same annealing process, in case that the overall oxidation ability of the oxidation reaction between the first metal oxide nanoparticle layer and the second metal is relatively stable and the conditions are sufficient, the content of the second metal oxide formed can gradually increase from the inside of the initial first metal oxide nanoparticle layer to the surface. Therefore, after the heating and annealing treatment, the stacked layer is formed on the surface of the anode substrate.

The stacked layer comprises: a first metal oxide nanoparticle layer, and a mixed material layer arranged on a surface of the first metal oxide nanoparticle layer far away from the quantum dot light-emitting layer. The mixed material layer comprises: first metal oxide nanoparticles, and a second metal oxide dispersed among gaps of the first metal oxide nanoparticles. First metal oxide nanoparticles in the first metal oxide nanoparticle layer serve as an electron transport material. A content of the second metal oxide in the mixed material layer gradually increases in a direction away from the anode.

In some embodiments, second metal in the initial second metal layer is one or more selected from the group consisting of aluminum, magnesium, titanium, copper, calcium, and indium.

In some embodiments, the second metal oxide is one or more selected from the group consisting of an oxide of aluminum, an oxide of magnesium, an oxide of titanium, an oxide of copper, an oxide of calcium, and an oxide of indium.

After the metal in the initial second metal layer penetrates into the gaps of the first oxide nanoparticles, the second metal may be fully oxidized by setting different condition, so that the mixed material no longer contains elemental second metal. In some embodiments, due to the volatilization of elements such as C and H, the material of the mixed material layer is composed of the first metal oxide nanoparticles and the second metal oxide. If the second metal is not sufficiently oxidized, the mixed material may contain elemental second metal that is unoxidized and dispersed among the gaps of the first oxide nanoparticles. In some embodiments, because the deeper the second metal going into the first oxide nanoparticle, the less the content of the second metal does penetrate into the first oxide nanoparticle, therefore, the content of the second metal gradually increases in the direction from the quantum dot light-emitting layer to the cathode.

In some embodiments, in step S02 or step E02, in order to fully oxidize the second metal penetrating into the initial the first metal oxide nanoparticles, the material of the mixed material layer does not contain any second metal. The temperature for heating and annealing the anode substrate or the cathode substrate having the initial second metal layer vapor-deposited thereon is between 120 and 140° C. In some embodiments, the duration for heating and annealing process is between 25 and 50 mins. In some specific embodiments, the material of the mixed material layer is composed of the first metal oxide nanoparticles and the second metal oxide.

In some embodiments, in the step S02 or the step E02, the second metal penetrating into the initial the first metal oxide nanoparticles is not sufficiently oxidized, and the mixed material layer further includes the second metal dispersed among the gaps of the first metal oxide nanoparticles. The temperature for heating and annealing the anode substrate or the cathode substrate having the initial second metal layer vapor-deposited thereon is between 80 and 120° C. In some embodiments, the duration for the heating and annealing process between 25 and 50 mins. In some specific embodiments, the mixed material layer is composed of: the first metal oxide nanoparticles, and the second metal oxide and the second metal dispersed among the gaps of the first metal oxide nanoparticles.

The thickness of the initial second metal layer vapor-deposited on the anode substrate or the cathode substrate also has different effects on the final structure. In some embodiments, the vapor-deposition thickness of the initial second metal layer is between 2 and 10 nm. In some embodiments, the vapor-deposition thickness of the initial second metal layer is between 2 and 4 nm. Within such thickness range, the second metal will almost completely penetrate into the oxide to form the mixed material layer during the heating and annealing process. The mixed material layer can lower the potential barrier, lower the working voltage, and isolate from water and oxygen. In some embodiments, the vapor-deposition thickness of the initial second metal layer is between 4 and 10 nm. Within such thickness range, a part of the unpenetrated metal still remains on a surface of the first metal oxide nanoparticle layer during the heating and annealing process. The addition of a second metal layer increases the adhesion to the upper electrode and forms an Ohmic contact. However, if the thickness of the second metal layer is >10 nm, the light transmission performance will be affected, and the light cannot be effectively emitted. In some embodiments, the thickness of the second metal layer is 0-5 nm, but not 0. In some specific embodiments, the second metal in the second metal layer is one or more selected from the group consisting of aluminum, magnesium, titanium, copper, calcium, and indium. The second metal of said species have high activity and is capable of reacting with hydroxyl groups on surfaces of the first metal oxide nanoparticles to form metal oxides.

In some embodiments, after step S02, a layer of a cathode is deposited on a surface of the substrate after heating and annealing process. In some embodiments, after step E02, a quantum dot light-emitting layer is deposited on a surface of the substrate after heating and annealing process. In this way, a structure where the quantum dot light-emitting layer, the stacked layer, and the cathode are stacked and bonded together.

In some embodiments, the cathode or anode material includes, but is not limited to, one or more of metal materials, carbon materials, and metal oxides. The metal material includes, but is not limited to, one or more of Al, Ag, Cu, Mo, Au, Ba, Ca, and Mg. The carbon material includes, but is not limited to, one or more of graphite, carbon nanotubes, graphene, and carbon fibers. The metal oxide may be doped or undoped metal oxide, including, but not limited to, one or more of ITO, FTO, ATO, AZO, GZO, IZO, MZO, AMO, and may also include a composite electrode formed by sandwiching metals between the doped or undoped metal oxide. In some particular embodiments, the composite electrode includes one or more of AZO/Ag/AZO, AZO/Al/AZO, ITO/Ag/ITO, ITO/Al/ITO, ZnO/Ag/ZnO, ZnO/Al/ZnO, $TiO_2$/Ag/$TiO_2$, $TiO_2$/Al/$TiO_2$, ZnS/Ag/ZnS, ZnS/Al/ZnS, $TiO_2$/Ag/$TiO_2$, and $TiO_2$/Al/$TiO_2$. In case that the top-emitting device is adopted, the top electrode is a transparent electrode, and in some embodiments, the top electrode adopts the above metal or metal composite electrode, and the thickness of the metal part should not exceed 20 nm, so as to ensure that the top electrode has a visible light transmittance of no less than 90%. In case that the bottom-emitting device is adopted, the bottom electrode is a transparent electrode, and in some embodiments, the bottom electrode adopts the above metal or metal composite electrode, and the thickness of the metal part should not exceed 20 nm, so as to ensure that the bottom electrode has a visible light transmittance of no less than 90%.

In some embodiments of the present application, the quantum dot light-emitting layer is arranged between the cathode and the anode. In some embodiments of the present application, the quantum dot light-emitting layer is made of a material being a direct band gap compound semiconductor having light-emitting capability, which includes but is not limited to one or more of II-VI compounds, III-V compounds, II-V compounds, III-VI compounds, IV-VI compounds, I-III-VI compounds, II-IV-VI compounds, and IV simple substances.

In some embodiments, the semiconductor materials used in the quantum dot light-emitting layer include a nano-crystalline of II-VI semiconductors or a II-VI core-shell structured nano-crystalline. In particular, the nano-crystalline of II-VI semiconductors includes, but are not limited to, CdS, CdSe, CdTe, ZnS, ZnSe, ZnTe, HgS, HgSe, HgTe, PbS, PbSe, PbTe, and other binary, ternary, and quaternary II-VI compounds.

In some embodiments, the semiconductor materials used in the quantum dot light-emitting layer include a nano-crystalline of III-V semiconductors or a III-V core-shell structured nano-crystalline. In particular, the nano-crystalline of III-V semiconductors includes, but are not limited to, GaP, GaAs, InP, InAs, and other binary, ternary, and quaternary III-V compounds.

In some embodiments, the semiconductor materials configured for the quantum dot light-emitting layer are not limited to II-V compounds, III-VI compounds, IV-VI compounds, I-III-VI compounds, II-IV-VI compounds, and IV elements.

In some embodiments, the material for the quantum dot light-emitting layer may be at least one of a doped or undoped inorganic perovskite semiconductor and an organic-inorganic hybrid perovskite semiconductor. Specifically, in some embodiments, the inorganic perovskite semiconductor has a structural formula of $AMX_3$, where A is $Cs^+$ ion, M is a divalent metal cation, including but not limited to $Pb^{2+}$, $Sn^{2+}$, $Cu^{2+}$, $Ni^{2+}$, $Cd^{2+}$, $Cr^{2+}$, $Mn^{2+}$, $Co^{2+}$, $Fe^{2+}$, $Ge^{2+}$, $Yb^{2+}$, $Eu^{2+}$, and X is halogen anion, including but not limited to $Cl^-$, $Br^-$, $I^-$.

In some embodiments, the organic-inorganic hybrid perovskite semiconductor has a structural formula of $BMX_3$, where B is an organic amine cation, including but not limited to $CH_3(CH_2)_{n-2}NH_3^+$ (n≥2) or $NH_3(CH_2)_nNH_3^{2+}$ (n≥2). When n=2, the inorganic metal halide octahedrons $MX_6^{4-}$ are connected in a manner of co-apex, the metal cation M is located in the body center of each halogen octahedron, and the organic amine cations B are filled in the gap between the octahedrons, forming an infinitely extending three-dimensional structure. When n>2, the inorganic metal halide octahedrons $MX_6^{4-}$ connected in the manner of co-apex extend in a two-dimensional direction to form a layered structure, and an organic amine cationic bilayer (protonated monoamine) or organic amine cation monolayer (protonated diamine) is intercalated in the layered structure, the organic layer and the inorganic layer overlap to form a stable two-dimensional layered structure; M is a divalent metal cation, including but not limited to $Pb^{2+}$, $Sn^{2+}$, $Cu^{2+}$, $Ni^{2+}$, $Cd^{2+}$, $Cr^{2+}$, $Mn^{2+}$, $Co^{2+}$, $Fe^{2+}$, $Ge^{2+}$, $Yb^{2+}$, $Eu^{2+}$; X is a halogen anion, including but not limited to $Cl^-$, $Br^-$, and $I^-$.

In some embodiments, the first metal oxide nanoparticles in the first metal oxide nanoparticle layer serve as the electron transport material; and the first metal oxide nanoparticles are one or more selected from the group consisting of ZnO, $TiO_2$, $SnO_2$, $Ta_2O_3$, $ZrO_2$, NiO, TiLiO, ZnAlO, ZnMgO, ZnSnO, ZnLiO and InSnO.

The quantum dot light-emitting diode fabricated by the above methods have significantly extended working life. The mixed material layer includes the first metal oxide nanoparticles for electron transportation as well as the second metal oxide, and the content of the second metal oxide presents a gradual change in its distribution in the mixed material layer (that is, the content of the second metal oxide in the mixed material layer gradually increases in the direction from the quantum dot light-emitting layer to the cathode), therefore, the obtained stacked layer has a decreased LUMO energy level, such that the injection barrier between the cathode and the first metal oxide nanoparticle layer is lowered, the material degradation caused by the electron accumulation at the barrier interface is attenuated, and the working life of the device is effectively improved.

In addition, the second metal oxide is arranged between the first metal oxide nanoparticles and the cathode material, which is conducive to forming a more effectively Ohmic contact between the cathode and the stacked layer, particularly the first metal oxide nanoparticle layer, thereby lowering the starting voltage and the working voltage. In the meanwhile, the introduction of the second metal oxide may increase the oxygen vacancies and effectively improve the electron mobility. Therefore, in order to achieve the same brightness, the quantum dot light-emitting diode of the present application only requires much lower current to be driven thereby effectively reduces thermal accumulation of the device, and prolonging the working life of the device. Moreover, according to the failure analysis of the quantum dot light-emitting diode, in the upright structure device, the top electrode (the cathode) tends to adsorb the water vapor and oxygen during the working process. When the water vapor and oxygen permeate, bubbles are easily formed between the top electrode and the first metal oxide nanoparticle layer, which will eventually cause the electrode to peel off. In the present application, the stacked layer added with the second metal oxide is capable of effectively prevent the corrosion of the water vapor and the oxygen, which is conducive to improving the adhesion between the cathode and the stacked layer, improving the stability of the device, and extending the working life.

The present application is described in details hereinbelow in combination with the following examples.

Example 1

A method for fabricating a quantum dot light-emitting diode in an upright top-emitting structure is performed as follows:
poly(3,4-ethylenedioxythiophene):poly(styrenesulfonate) (PEDOT:PSS) is spin-coated on an indium-tin oxide (ITO) substrate at a rotational speed of 5000 rpm for 30 seconds, and then heated at 150° C. for 15 minutes to prepare a hole injection layer;
8 mg/mL poly(9,9-dioctylfluorene-alt-N-(4-sec-butylphenyl)-diphenylamine) (TFB) is spin-coated on the hole injection layer at a rotational speed of 3000 rpm for 30 seconds, and then heated at a temperature of 150° C. for 30 minutes to prepare a hole transport layer;
20 mg/mL quantum dot is spin-coated on the hole transport layer at a rotational speed of 2000 rmp for 30 seconds to prepare a quantum dot light-emitting layer;
30 mg/mL nano-ZnO is spin-coated on the quantum dot light-emitting layer at rotational speed of 3000 rmp for 30 seconds, and then heated at a temperature of 80° C. for 30 minutes to prepare a nano-ZnO layer;
under a vacuum degree of no higher than $3\times10^{-4}$ Pa, Al is vapor-deposited on the nano-ZnO layer by thermal evaporation at a speed of 1 angstroms/second for 100 seconds to prepare an Al layer having a thickness of 10 nm;
a resulting sample is placed on a heating plate which is preset to 120° C. and heated for 30 minutes to prepare a stacked layer; and
under a vacuum degree of no higher than $3\times10^{-4}$ Pa, Ag is vapor-deposited on the stacked layer at a speed of 1 angstroms/second for 200 seconds to prepare a silver electrode having a thickness of 20 nm, whereby obtaining a quantum dot light-emitting diode in an upright top-emitting structure.

Example 2

A method for fabricating a quantum dot light-emitting diode in an inverted bottom-emitting structure is performed as follows:
under a vacuum degree of no higher than $3\times10^{-4}$ Pa, Ag is vapor-deposited on an ITO substrate at a speed of 1 angstrom/second for 100 seconds to prepare a silver layer having a thickness of 10 nm;
30 mg/mL nano-ZnO is spin-coated on the silver layer at a rotational speed of 3000 rmp for 30 seconds, and then heated at a temperature of 80° C. for 30 minutes to prepare a nano-ZnO layer;
a resulting sample is placed on a heating plate which is preset to 120° C. and heated for 30 minutes to prepare a stacked layer;
20 mg/mL quantum dot is spin-coated on the stacked layer at a rotational speed of 2000 rmp for 30 seconds to prepare a quantum dot light-emitting layer;
8 mg/mL polyvinylcarbazole (PVK) is spin-coated on the quantum dot light-emitting layer at a rotational speed of 3000 rmp for 30 seconds, and then heated at a temperature of 100° C. for 10 minutes to prepare a PVK layer;
8 mg/mL polymaleic anhydride (PMAH) is spin-coated on the PVK layer at a rotational speed of 3000 rpm for 30 seconds, and then heated at a temperature of 100° C. for 10 minutes to prepare a PMAH layer; and
under a vacuum degree of no higher than $3\times10^{-4}$ Pa, Ag is vapor-deposited on the PMAH layer by thermal evaporation at a speed of 1 angstroms/second for 700 seconds, and a thickness of 70 nm, to obtain a quantum dot light-emitting diode in an inverted bottom-emitting structure.

The foregoing embodiments are merely intended for describing the technical solutions of the present application rather than limiting the present application. For those skilled in the art, this application can have various modifications and changes. Any modification, equivalent replacement, improvement, etc. made within the spirit and principle of the present application shall be included in the scope of the claims of this application.

What is claimed is:
1. A quantum dot light-emitting diode, comprising:
a cathode and an anode which are oppositely arranged;
a quantum dot light-emitting layer arranged between the cathode and the anode; and
a stacked layer arranged between the cathode and the quantum dot light-emitting layer; wherein
a stacked layer comprises: a first metal oxide nanoparticle layer, and a mixed material layer arranged on a surface of the first metal oxide nanoparticle layer far away from the quantum dot light-emitting layer;
the mixed material layer comprises: first metal oxide nanoparticles, and a second metal oxide dispersed among gaps of the first metal oxide nanoparticles;
first metal oxide nanoparticles in the first metal oxide nanoparticle layer serve as an electron transport material; and a content of the second metal oxide in the mixed material layer gradually increases in a direction from the quantum dot light-emitting layer to the cathode.

2. The quantum dot light-emitting diode according to claim 1, wherein the mixed material layer is composed of the first metal oxide nanoparticles and the second metal oxide.

3. The quantum dot light-emitting diode according to claim 1, wherein the mixed material layer further comprises a second metal dispersed among the gaps of the first metal oxide nanoparticles.

4. The quantum dot light-emitting diode according to claim 3, wherein in the direction from the quantum dot light-emitting layer to the cathode, the content of the second metal oxide gradually increases, and a content of the second metal gradually increases.

5. The quantum dot light-emitting diode according to claim 3, wherein the mixed material layer is composed of:
the first metal oxide nanoparticles, and
the second metal oxide and the second metal that are dispersed among the gaps of the first metal oxide nanoparticles.

6. The quantum dot light-emitting diode according to claim 1, wherein the second metal oxide is one or more selected from the group consisting of an oxide of aluminum, an oxide of magnesium, an oxide of titanium, an oxide of copper, an oxide of calcium, and an oxide of indium.

7. The quantum dot light-emitting diode according to claim 3, wherein the second metal is one or more selected from the group consisting of aluminum, magnesium, titanium, copper, calcium, and indium.

8. The quantum dot light-emitting diode according to claim 1, further comprising a second metal layer bound to a surface of the stacked layer facing the cathode.

9. The quantum dot light-emitting diode according to claim 8, wherein the second metal layer has a thickness of between 0 and 5 nm.

10. The quantum dot light-emitting diode according to claim 8, wherein second metal in the second layer is one or more selected from the group consisting of aluminum, magnesium, titanium, copper, calcium, and indium.

11. The quantum dot light-emitting diode according to claim 1, wherein the first metal oxide nanoparticles are one or more selected from the group consisting of ZnO, $TiO_2$, $SnO_2$, $Ta_2O_3$, $ZrO_2$, NiO, TiLiO, ZnAlO, ZnMgO, ZnSnO, ZnLiO and InSnO.

12. The quantum dot light-emitting diode according to claim 1, wherein the quantum dot light-emitting layer, the stacked layer, and the cathode are stacked together.

13. A method for fabricating the quantum dot light-emitting diode according to claim 1, comprising the following steps:

providing the anode substrate, wherein the anode substrate is provided with an anode, the initial first metal oxide nanoparticle layer is arranged at the surface of the anode substrate, and the first metal oxide nanoparticles in the initial first metal oxide nanoparticle layer serve as the electron transport material; and vapor depositing the initial second metal layer onto the initial first metal oxide nanoparticle layer, and heating and annealing the anode substrate having the initial second metal layer vapor deposited thereon, whereby forming the stacked layer on the surface of the anode substrate.

14. The method for fabricating a quantum dot light-emitting diode according to claim 13, wherein the initial first metal oxide nanoparticle layer has a thickness of between 30 and 50 nm; the initial second metal layer has a thickness of between 1 and 10 nm.

15. The method for fabricating a quantum dot light-emitting diode according to claim 13, wherein the anode substrate having the initial second metal layer vapor deposited thereon is heated and annealed at a temperature of between 80 and 140° C. for a duration of between 25 and 50 mins.

16. The method for fabricating a quantum dot light-emitting diode according to claim 13, wherein the anode substrate having the initial second metal layer vapor deposited thereon is heated and annealed at a temperature of between 120 and 140° C.; and the mixed material layer is composed of the second metal oxide and the first metal oxide nanoparticles.

17. The method for fabricating a quantum dot light-emitting diode according to claim 13, wherein the anode substrate having the initial second metal layer vapor deposited thereon is heated and annealed at a temperature of between 80 and 120° C.; and the mixed material layer further comprises a second metal dispersed among the gaps of the first metal oxide nanoparticles.

18. The method for fabricating a quantum dot light-emitting diode according to claim 13, wherein second metal in the initial second metal layer is one or more selected from the group consisting of aluminum, magnesium, titanium, copper, calcium, and indium.

19. The method for fabricating a quantum dot light-emitting diode according to claim 13, further comprising:
forming a second metal layer bound to a surface of the stacked layer facing a cathode.

20. The method for fabricating a quantum dot light-emitting diode according to claim 13, wherein a layer of a cathode is deposited on a surface of the substrate after heating and annealing process.

* * * * *